United States Patent [19]
Berglund et al.

[11] Patent Number: 5,103,101
[45] Date of Patent: Apr. 7, 1992

[54] MULTIPHASE PRINTING FOR E-BEAM LITHOGRAPHY

[75] Inventors: C. Neil Berglund, Oregon City, Oreg.; John R. Thomas, Oakland; John T. Poreda, Moraga, both of Calif.

[73] Assignee: Etec Systems, Inc., Hayward, Calif.

[21] Appl. No.: 664,066

[22] Filed: Mar. 4, 1991

[51] Int. Cl.$^5$ .......................................... H01J 37/302
[52] U.S. Cl. ................................... 250/492.2; 250/398
[58] Field of Search ........... 250/492.2, 492.22, 492.21, 250/492.3, 398, 396, 396 ML

[56] References Cited

U.S. PATENT DOCUMENTS

4,498,010  2/1985  Biechler et al. ............... 250/492.22
4,586,141  4/1986  Yasuda et al. .................. 250/492.22

Primary Examiner—Jack I. Berman
Attorney, Agent, or Firm—Skjerven, Morrill, MacPherson, Franklin & Friel

[57] ABSTRACT

A method for a raster scan particle or light beam lithography system for writing in multiple passes interleaved in such a manner as to achieve a composite result nearly identical to normal single pass raster scan writing with overlapped spots. Multiple pass writing, achieved with little or no degradation or throughput or lithography quality, provides an ideal platform for implementation of known image averaging techniques to improve lithography quality. This technique is combined with the known writing technique of "Virtual Addressing" to improve resolution with little or no degradation of throughput.

17 Claims, 8 Drawing Sheets

MULTIPHASE PRINTING FOR E-BEAM LITHOGRAPHY

BACKGROUND OF THE INVENTION

1. Field of the Invention

This invention relates to particle or light beam systems used in the manufacture of microminiature electronic devices (integrated circuits) and is particularly directed to a new and improved writing technique for raster scan beam lithography system; the primary object of this invention is to provide a multiple pass writing strategy for a raster scan lithographic system without reduction in throughput, and thereby provide an optimal platform for implementation of known techniques for improving both lithography quality and throughput.

2. Prior Art

Lithographic systems using a controllable electron beam, sometimes called E-beam machines, for the fabrication of integrated circuits are old in the art; one such system is described at length in the U.S. Pat. No. 3,900,737 to Collier et al. and another in the U.S. Pat. No. 3,801,792 to Lin.

In these machines, a medium of resist (or photosensitive) material upon which the electron beam is to perform its writing operation is positioned on a motor driven stage which is moved continuously and in synchronism as the beam is scanned in a raster fashion (a raster scan) in a direction perpendicular to the stage motion. In practice, the diameter of the round electron beam spot, also called a "gaussian spot" or "pixel", focused on the resist layer, is of the order of (but not necessarily equal to) the writing address dimension (or address unit, au) of the cartesian grid on which it is written. Adjacent rows of pixels in the stage travel direction define the width of a "feature" and the length of the feature is formed by a number of pixels in the raster scan direction. In practice, adjacent "on" pixels in the same raster scan are not written separately but "scanned" with the beam on until an "off" pixel is encountered. For the purposes of this disclosure, descriptions are given in terms of the normal full pixelization representation. The pattern on the resist defined by the beam scan and by the stage movement is determined by the system control equipment and software therefor.

Prior art teaches that repetitive imaging strategies for raster scanning lithographic systems are desirable. Repeated writing of scanlines placing pixels in nominally the same location has long been used to increase the dose of energy delivered to the patterned area on the substrate. The higher dose allows the use of less sensitive but higher resolution resist coatings for improved lithography. Additionally, the redundancy averages out some of the random errors in the lithographic system. Further improvement may be obtained by offsetting the data within the raster scanline so that the repeated image spots (pixels) are still written redundantly at nominally the same substrate location, but from a different portion of the scanline. Lithography is improved because of averaging of systematic errors of the lithographic system. This is described in "Image Quality Enhancements for Raster Scan Lithography", L. Rieger, et al, 1988 SPIE Santa Clara Symposium. With a conventional writing technique, throughput is disadvantageously reduced proportional to the number of passes required for the repetitive imaging.

Other pertinent prior art is disclosed in "RASTERIZING SYSTEM UTILIZING AN OVERLAY OF BIT-MAPPED LOW ADDRESS RESOLUTION DATABASES" U.S. Pat. No. 4,879,605. to Warkentin, et al. A multi-pass writing technique is disclosed which requires multiple edge definitions achieved by varying the dosage at an edge dependent upon the desired location of a given edge. With a normal raster scan writing technique, feature edges are logically defined in the obvious manner by a row of exposed or "on" pixels at the feature edge. Incorporation of nonhomogeneous edge definitions into the writing technique requires more stringent control over other lithographic system and image development parameters to make all edges appear alike and resolve to the proper location when the image is developed.

It is further known that a large spot (pixel) overlapped by 40-50% on a smaller writing grid may be used to produce excellent lithography results with a raster scanning lithographic system. Overlapping of large spots in this manner has been used in single pass writing technique to increase dosage over that which is attainable without overlapped spots and without the attendant reduction of throughput required by the repeated scan method described above.

SUMMARY OF THE INVENTION

The writing technique in accordance with this invention is performed in a raster scanning particle beam lithography system having, inter alia, a particle beam source, a means of beam blanking, a means of deflecting said beam in scan lines, and a means of focusing said beam onto a resist-coated substrate positioned on a moveable stage. The final pixelization of the lithographic pattern on the substrate consists of pixels whose centers are placed on a cartesian writing grid as if with a normal raster scan writing technique. Multiphase printing achieves this pixelization by interleaving pixels in a series of passes, over a coarser (larger writing address dimension) grid. Each pass is offset from others by a fraction of the writing address required to achieve the composite cartesian pixel array. Each pass is called a phase.

Since the throughput of a raster scan system increases as the square of the writing grid, multiple passes are achieved with little or no loss of throughput. Since pixels are interlaced on a cartesian grid, all feature edges are logically the same. Spot size may be adjusted to that pixels overlap by a substantial fraction of the pixel size. The result is virtually identical to single pass overlapping of larger spots which the prior art teaches may be used to achieve good lithography quality. Since this present technique is accomplished in multiple passes, it allows the implementation of redundant imaging schemes without the throughput sacrifice required with a normal raster writing technique. Additionally, it provides an improved platform for the implementation of the virtual addressing technique described in "VIRTUAL ADDRESSING FOR E-BEAM LITHOGRAPHY", U.S. Pat. No. 4,498,010 to Biechler et al. (incorporated by reference).

Interleaving of pixels in separate passes over separate sets of pixels on a cartesian grid is performed in accordance with the invention. Using this interleaving as a platform for virtual addressing is a second aspect of the invention which is an improvement over the above-referenced virtual addressing method.

The invention is applicable to raster scanning systems generally, not just those using E-beams; for instance, a laser beam or other light beam could be used. The exposed material could include materials other than photo-resist, such as photographic film, that is subject to accumulated changes from multiple exposures.

DETAILED DESCRIPTION OF INVENTION

Figure 1:
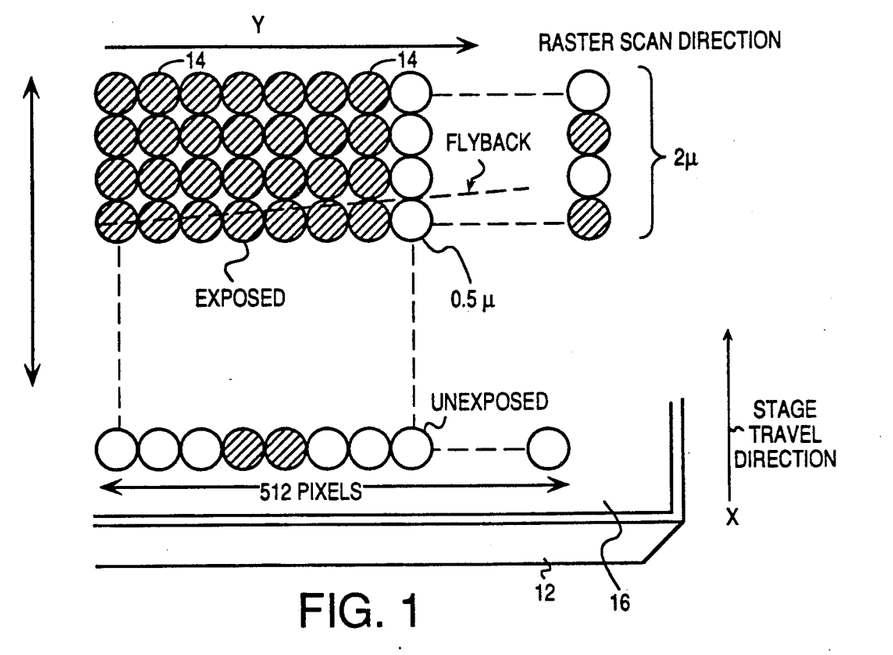
FIGS. 1 and 2 show a lithographic system for writing on a resist.

FIG. 1 illustrates a writing operation by an E-beam machine similar to the writing operation taught in the Collier et al. patent disclosure. As shown in this figure, the arrow "X" represents the movement of the stage 12 and the arrow "Y" represents the movement of the electron beam in a raster scan fashion. In this system, an address or pixel is defined as the diameter of the beam spot on the medium. As illustrated, circles 14 represent beam spots or pixels on a resist 16 (resist coated substrate) and to illustrate the effect of the modulation (or blanking) of the beam, certain of the pixels are shown blank (unexposed) while others are shown solid (exposed). Modulation or blanking of the beam in the Collier et al. apparatus occurred at 10 MHz with 4 rows of pixels defining a 2.0 micrometer feature width and 512 pixels defining a 128 micrometer length utilizing a pixel size of 0.5 micrometers. One embodiment of the invention is very similar to that of the Collins et al patent disclosure, with the exceptions that (1) the pixel size is variable and independent of the center-to-center pixel distance (address unit or writing address dimension); and (2) the raster scan length is variable and may contain as many as 4096 pixels in one embodiment.

Figure 2:
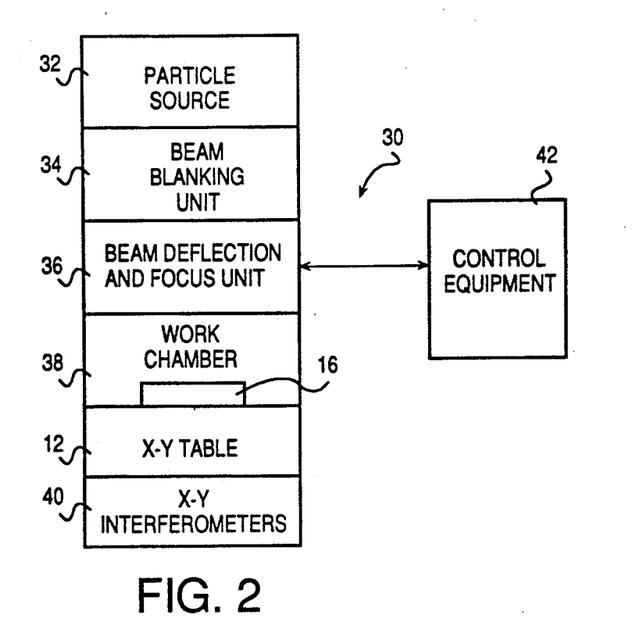

FIG. 2 illustrates a particle beam lithographic system 30 (as illustrated in above-referenced U.S. Pat. No. 4,498,010 to Biechler et al.) utilizable for accomplishing the above writing technique which comprises a particle or electron source 32, a beam modulating or blanking unit 34 for providing the modulation of the beam, a beam deflection and focus unit 36, a work chamber 38 containing the stage 12 with resist 16 and a means for determining the registration of the beam at the proper coordinates, all under the control of control equipment 42. This system is similar to the prior art systems of the Collier et al. and Lin patent disclosures.

When the desired writing on the resist is complete, the resist is processed by conventional lithographic development techniques resulting in features as defined by the pixels during writing.

To accomplish multiphase printing, geometric data is decomposed into pixels in multiples of the basic geometric representation and printed in multiple phases. The particular case of four phases is illustrated here in detail. Each pixel in the normal single pass rasterization of a geometric figure on a 1x grid is referenced by a two coordinate pixel address, (x,y), with (0,0) referring to the lowest and left-most pixel address of the pattern. The scan conversion algorithm for the first phase places into the pattern memory only those pixels belonging to the figure which are even in both x and y. These pixels are labelled "A" in FIG. 3. The "A" pixels are then written on an address grid which is twice (2X) that of the normal single pass rasterization of the geometric figure.

Figure 3:
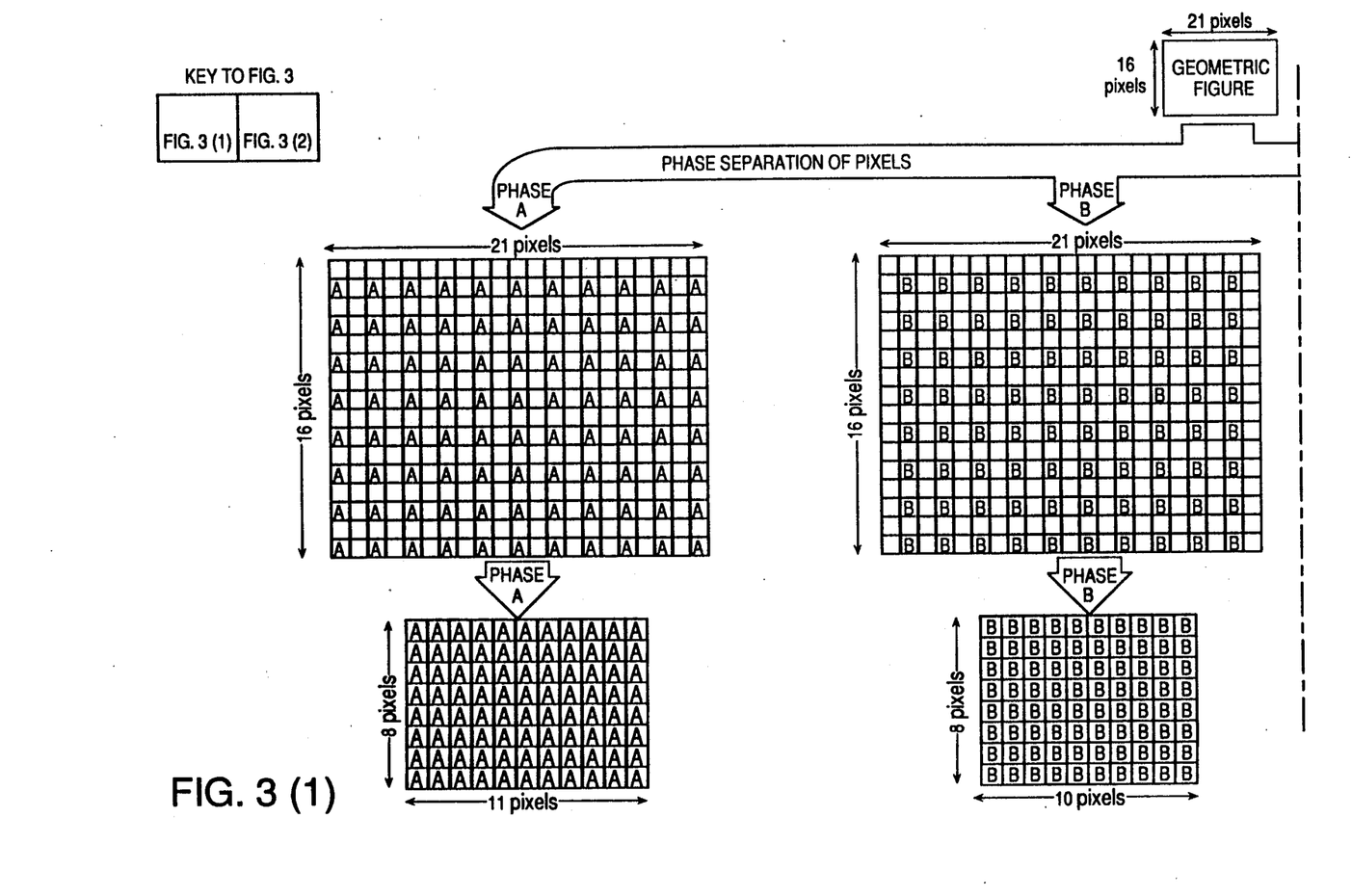
FIGS. 3 and 4 show multiphase printing.

Similarly the scan conversion algorithms for the second, third and fourth phases choose (x,y) to be (odd, even), (even, odd) and (odd, odd) respectively. Each phase is written on the 2X write grid offset from other phases by a distance of X in the x and y directions. Specifically, the second (B) phase is offset by X in the positive x-direction from the first (A) phase; the third (C) phase is offset by X in the positive-y direction from the first (A) phase; and the fourth (D) phase is offset by X in the positive-y direction from the second (B) phase and by X in the positive x-direction from the third (C) phase.

Figure 4:
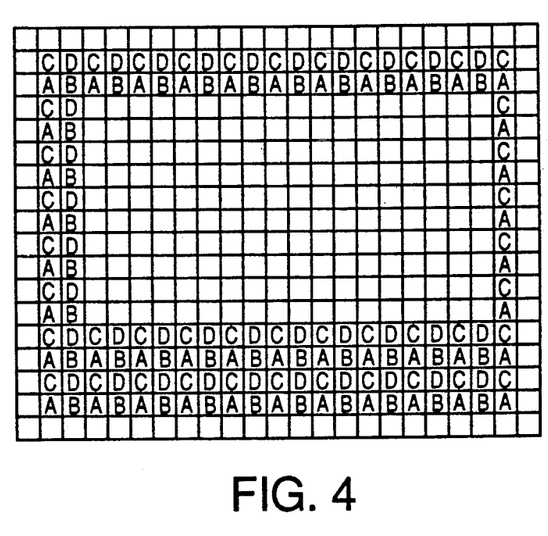

The composite result is an interleaved set of pixels placed on the 1X grid in one-to-one correspondence with the pixels which would have resulted from the normal pixelization of the 1X input pattern. The composite pixelization which results from the four phases is shown in FIG. 4. Note that if the spot size used to write this figure had been the same as the 2X write grid size, these pixels would be 50% overlapped. As mentioned above, it is known that a good lithography result can be achieved with such an overlap. Since each pass is written on an address grid which is twice that of the original pattern data, the time required to expose each phase is approximately one-fourth that of a normal single pass write. Because four phases are exposed, the resulting throughput advantageously is approximately the same as with a conventional single pass writing strategy. It should be obvious that more than four phases may be interleaved obtain a 1X cartesian composite pixelization. In general, $n^2$ phases may be written each on an X writing grid and interleaved by offsetting from its nearest neighbors by a distance X in the x and y directions in a manner entirely analogous to the four phase technique described above.

Virtual addressing is a known (see above) technique which achieves edge placement of one-half of the writing address. Given a 2X writing address grid, virtual addressing resolves edges to the 1X grid by turning off alternate pixels along those edges which fall between the 2X write grid lines. This effectively achieves a ½ dose along those edges causing them to resolve to the 1X address grid when developed in the resist.

Figure 5:
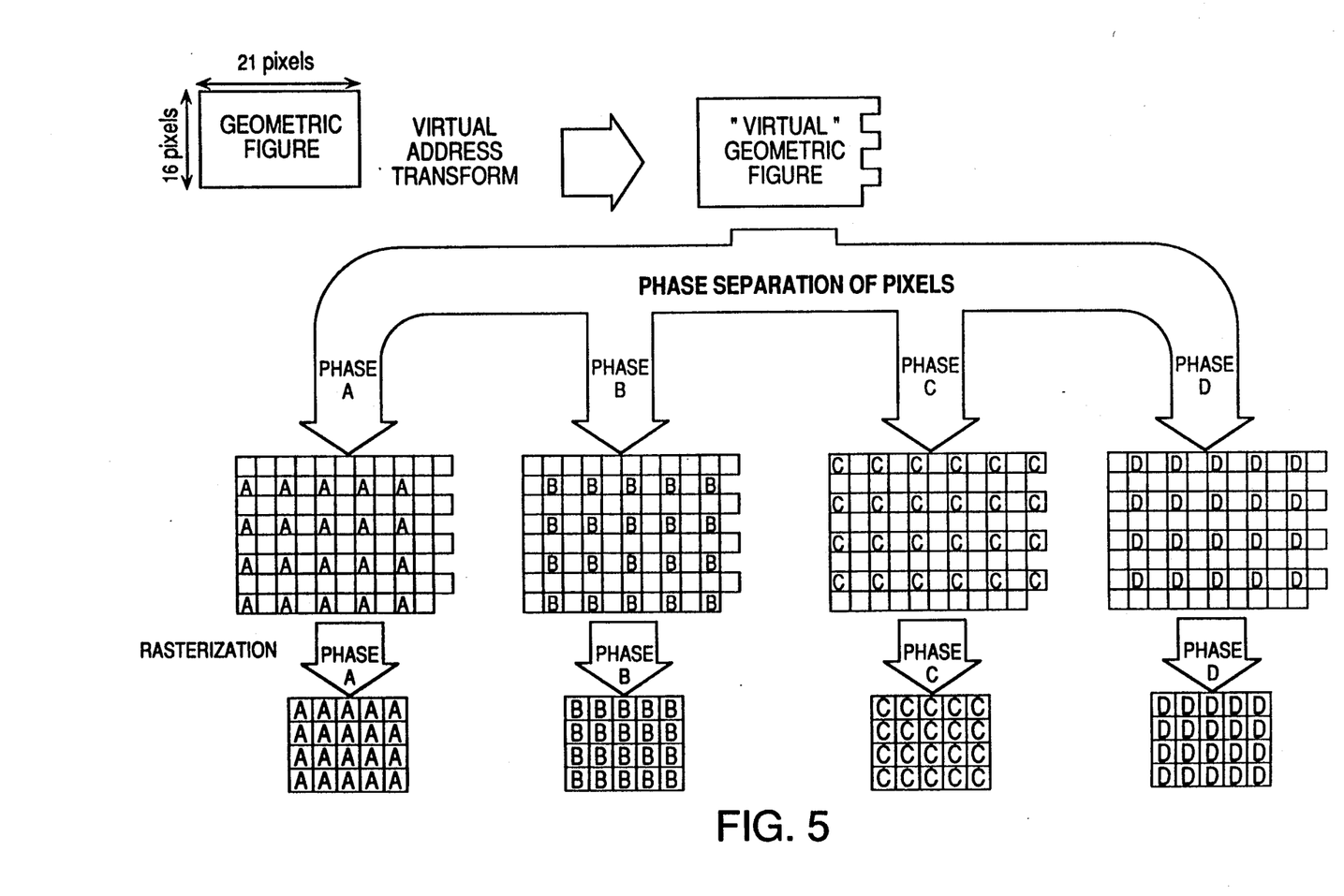
FIGS. 5 and 6 show multiphase printing with virtual addressing.
Figure 6:
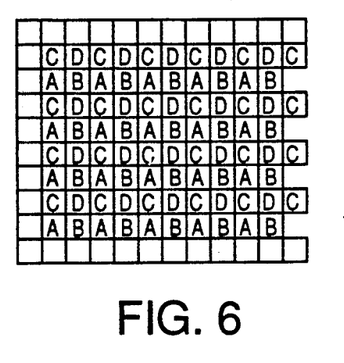

FIGS. 5 and 6 illustrate the application of the virtual addressing techniques in multiphase printing. Given an input pattern defined on a 1X grid, the pattern is written with multiphase printing in four phases on a 4X writing address grid (see FIG. 5). Multiphase printing achieves the resolution of appropriate edges to the 2X grid by offsetting the writing of each phase by ½ of the writing address of 4X. The right edge of the geometric figure is resolved back to the 1X grid by choosing not to write the "D" pixels along that edge during the scan conversion for the "D" phase. Note that if the writing spot size were the same as the writing address size, the pixels are 50% overlapped in the central part of the figure, while at the "dithered" virtual edge the "C" pixels exactly butt to one another (see FIG. 6). This results in a much smoother edge when developed in the resist than would be expected from this picture (FIG. 6) which depicts pixel center placement. This allows the application of the virtual addressing technique at larger address sizes than was possible with conventional single pass writing. Since the writing grid for each phase is 4X the input pattern grid, the time to expose each phase is roughly one-sixteenth the time required for a normal single pass write. The requirement of four phases results in a net throughput gain of approximately 4X.

Figure 7:
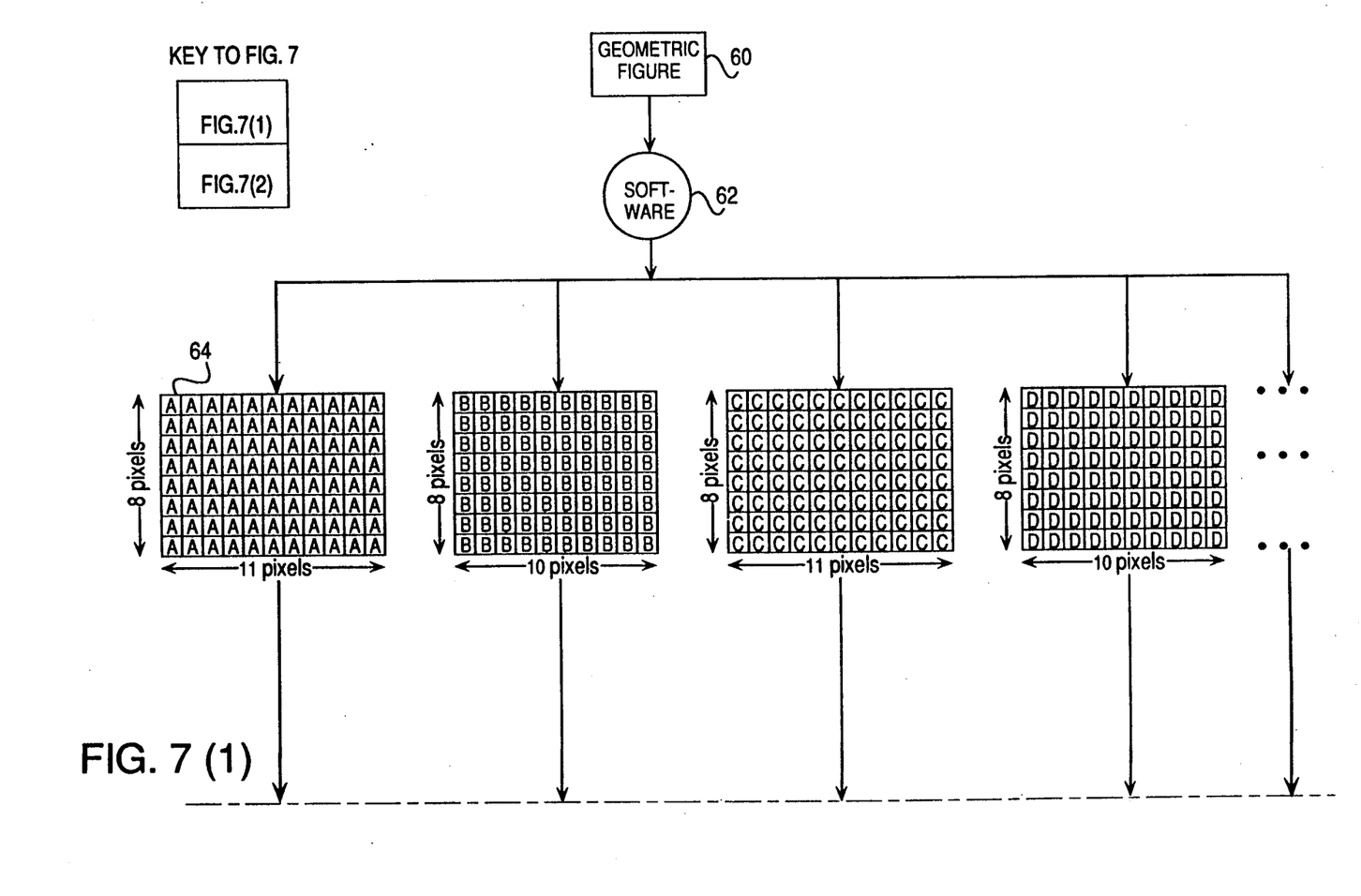
FIG. 7 is a flow chart of one embodiment of the invention.

FIGS. 3 and 5 show phase separation of pixels, virtual address transform and rasterization as separate processes for the purpose of clarification. In one embodiment (see FIG. 7) these processes are part of a single software transformation done for each phase. For each phase, software 62 transforms the CAD (computer aided design) figure data 60 into the proper bit map 64 held in a data buffer, for example, shift registers, from which the data is transferred to the raster scan lithography system 66 which exposes the photosensitive surface 70. A single bit map data buffer is quite large and each phase is completed before the next is begun. It should be obvious that, the size of the bit map buffer 64 is not fundamental to the invention. It should also be obvious that the portion of each phase completed before another phase is begun is also not important as long as the composite pixel pattern 68 is completely exposed on the photosensitive surface 70.

This description is illustrative and not limiting; further modifications will be apparent to one of ordinary skill in the art in the light of this disclosure and the appended claims.

What is claimed is:

1. In the generation of a pattern for use in the fabrication of integrated circuits in a rasterscan lithography system, the steps in the process comprising:
   forming a beam of a predetermined diameter defining the width of a pixel of the pattern;
   providing a material sensitive to said beam to be irradiated by the beam;
   forming a plurality of said pixels by directing said beam onto said material;
   controlling said beam as it forms said pixels to form an array of pixels, each pixel being an element of a feature of the pattern of a predetermined length and width;
   repeating the steps of forming and controlling a plurality of times, with each step forming a separate array of pixels, each pixel being an element of a predefined feature not formed in a previous step of forming such that the composite of all steps of forming forms a plurality of adjacent lines of said pixels, said lines defining a feature of the pattern of predetermined length and width.

2. The method of claim 1, wherein said beam is an electron beam.

3. The method of claim 1, wherein said beam is a light beam.

4. The method of claim 1, wherein said beam is an ion beam.

5. The method of claim 1, wherein each pixel overlaps an adjacent pixel by about 50% of a pixel width.

6. The method of claim 1, further comprising the step of defining an edge of said feature by forming only alternate pixels along said edge.

7. The method of claim 1, wherein the step of repeating includes repeating three times, thereby forming said pattern in four passes.

8. In the generation of a raster scan pattern, the steps comprising:
   forming a beam of a predetermined diameter defining the width of an element of the pattern;
   providing a material sensitive to said beam to be irradiated by the beam;
   forming a plurality of said elements by directing said beam onto said material;
   controlling said beam as it forms said elements to form a plurality of adjacent lines of said elements, said lines defining a portion of the pattern of a predetermined length and width;
   repeating the steps of forming and controlling a plurality of times, with each step forming a separate array of elements, each element being a portion of the same predefined feature and not being formed in a previous step of forming; and
   developing the pattern in the material.

9. A rasterscan system for forming a pattern on a radiation sensitive material comprising:
   means for forming a radiating beam of a predetermined diameter defining the width of a pixel of the pattern;
   means for forming a plurality of said pixels on said material by directing said beam onto said material;
   means for controlling said beam as it forms said pixels to form an array of pixels, each pixel being a feature of the pattern; and
   means for repeating the forming of said pixels by passing said beam across said material a plurality of times, with each pass forming a separate array of pixels, each pixel being an element of a predefined feature not formed in a previous pass, such that all passes together form a plurality of adjacent lines of said pixels, said lines defining a feature of the pattern of predetermined length and width.

10. In the generation of patterns for lithography using a raster scanning pattern generation apparatus, a method of printing a raster pattern, as defined by a plurality of pixels formed on a grid in a plurality of $n^2$ passes where n is an integer greater than 1, comprising:
    forming a beam of a predetermined diameter defining the width of each pixel;
    providing a material sensitive to the beam to be irradiated by said beam on a substrate;
    forming the pixels by directing said beam onto said material;
    controlling said beam as it forms said pixels onto said grid, thereby imaging every nth pixel of said plurality of pixels that define said raster pattern and exposing the first of $n^2$ passes;
    repeating the steps of forming and controlling the beam to form a plurality of pixels onto said grid, with each pass offset from each previous pass, until a total of $n^2$ passes have been exposed, and a plurality of pixels have been formed in a one-to-one correspondence with said raster pattern; and
    finally, developing the material.

11. The method of claim 10, wherein said beam is an electron beam.

12. The method of claim 10, wherein said beam is a light beam.

13. The method of claim 10, wherein the said beam is an ion beam.

14. The method of claim 10, wherein the pixels are arranged on said grid at a predetermined uniform spacing, each pass being offset from each previous pass along one dimension of said grid.

15. The method of claim 14, wherein the diameter is equal to n times said predetermined uniform spacing.

16. The method of claim 10, further comprising the step of positioning said substrate on a movable support.

17. The method of claim 10, further comprising the step of defining an edge of said pattern by the additional step of forming only alternate pixels along said edge.

* * * * *